(12) United States Patent
Watanabe et al.

(10) Patent No.: US 10,019,158 B2
(45) Date of Patent: Jul. 10, 2018

(54) DETERMINATION OF A READ VOLTAGE TO BE APPLIED TO A PAGE BASED ON READ VOLTAGES OF OTHER PAGES

(71) Applicant: Toshiba Memory Corporation, Tokyo (JP)

(72) Inventors: Daiki Watanabe, Yokohama Kanagawa (JP); Hiroshi Yao, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/444,723

(22) Filed: Feb. 28, 2017

(65) Prior Publication Data
US 2017/0271022 A1    Sep. 21, 2017

Related U.S. Application Data

(60) Provisional application No. 62/308,721, filed on Mar. 15, 2016.

(51) Int. Cl.
| | | |
|---|---|---|
| G06F 3/06 | (2006.01) | |
| G11C 16/26 | (2006.01) | |
| G06F 12/02 | (2006.01) | |
| G11C 29/02 | (2006.01) | |
| G11C 7/04 | (2006.01) | |
| G11C 11/56 | (2006.01) | |
| G11C 16/04 | (2006.01) | |

(52) U.S. Cl.
CPC ............. *G06F 3/06* (2013.01); *G06F 12/02* (2013.01); *G11C 16/26* (2013.01); *G11C 29/021* (2013.01); *G11C 29/028* (2013.01); *G11C 7/04* (2013.01); *G11C 11/5642* (2013.01); *G11C 16/0483* (2013.01)

(58) Field of Classification Search
CPC ......... G11C 16/26; G11C 16/349; G11C 7/04; G06F 3/06; G06F 12/02
See application file for complete search history.

(56) References Cited

U.S. PATENT DOCUMENTS

| | | |
|---|---|---|
| 7,848,150 B2 | 12/2010 | Lee et al. |
| 7,952,958 B2 | 5/2011 | Yanagidaira et al. |
| 8,472,274 B2 | 6/2013 | Fai et al. |

(Continued)

FOREIGN PATENT DOCUMENTS

| | | | |
|---|---|---|---|
| JP | 2009070542 A | 4/2009 | |
| JP | 2010040144 A | 2/2010 | |

(Continued)

*Primary Examiner* — Ajay Ojha
(74) *Attorney, Agent, or Firm* — Patterson & Sheridan, LLP

(57) ABSTRACT

A memory system includes a non-volatile memory and a controller. The controller is configured to maintain a relationship between a first parameter value and a second parameter value for each of some pages of the non-volatile memory, determine a first parameter value to be used for reading data from a target page of the non-volatile memory based on a first parameter value of a first page and a first parameter value of a second page, when the relationship is maintained for each of the first and second pages and is not maintained for the target page, and carry out a read operation with respect to the target page using the determined first parameter value.

20 Claims, 9 Drawing Sheets

(56) References Cited

U.S. PATENT DOCUMENTS

| | | | |
|---|---|---|---|
| 8,755,233 B2 | 6/2014 | Nagashima | |
| 9,183,083 B2 | 11/2015 | Sakurada et al. | |
| 2012/0102259 A1* | 4/2012 | Goss | G11C 7/04 711/103 |
| 2016/0132256 A1* | 5/2016 | Jung | G06F 3/0614 711/103 |

FOREIGN PATENT DOCUMENTS

| | | | |
|---|---|---|---|
| JP | 2012203692 A | 10/2012 | |
| JP | 2014509769 A | 4/2014 | |

\* cited by examiner

| LBA | PHYSICAL ADDRESS | INVALID FLAG |
|---|---|---|
| 0×21000 | BLOCK 2 PAGE 312 | 1 |
| 0×21002 | BLOCK 2 PAGE 314 | 0 |

| PAGE NUMBER | OPERATION PARAMETER |
|---|---|
| 0102412 | a1 [V] |
| 0103203 | a2 [V] |
| ... | ... |

| PAGE NUMBER | WRITING GENERATION NUMBER | POSITION INFORMATION | ENVIRONMENT INFORMATION | NUMBER OF READOUTS | NUMBER OF ERASURES |
|---|---|---|---|---|---|
| 0101001 | m | DEVICE** BLOCK** | **°C | 56 TIMES | 1056 TIMES |
| 0101002 | 2m | DEVICE** BLOCK** | **°C | 123 TIMES | 896 TIMES |
| ... | ... | ... | ... | ... | ... |

DETERMINATION OF A READ VOLTAGE TO BE APPLIED TO A PAGE BASED ON READ VOLTAGES OF OTHER PAGES

CROSS-REFERENCE TO RELATED APPLICATIONS

This application is based upon and claims the benefit of priority from U.S. Provisional Patent Application No. 62/308,721, filed on Mar. 15, 2016, the entire contents of which are incorporated herein by reference.

FIELD

Embodiments described herein relate generally to a memory system including a non-volatile memory and a method of operation the memory system.

BACKGROUND

When reading processing and writing processing are carried out with respect to a non-volatile memory, values of operating parameters such as a read voltage are set. By setting the values of the operating parameters appropriately, a reduction in error rates is achieved.

BRIEF DESCRIPTION OF THE DRAWINGS

FIG. 2 shows an example of contents of a conversion table.

FIG. 3 shows an example of contents of a first parameter table.

FIG. 4 shows an example of contents of a second parameter table.

DETAILED DESCRIPTION

A memory system according to an embodiment includes a non-volatile memory and a controller. The controller is configured to maintain a relationship between a first parameter value and a second parameter value for each of some pages of the non-volatile memory, determine a first parameter value to be used for reading data from a target page of the non-volatile memory based on a first parameter value of a first page and a first parameter value of a second page, when the relationship is maintained for each of the first and second pages and is not maintained for the target page, and carry out a read operation with respect to the target page using the determined first parameter value.

A memory system and a method of controlling a non-volatile memory according to an embodiment will be described below, with reference to the drawings.

Figure 1:
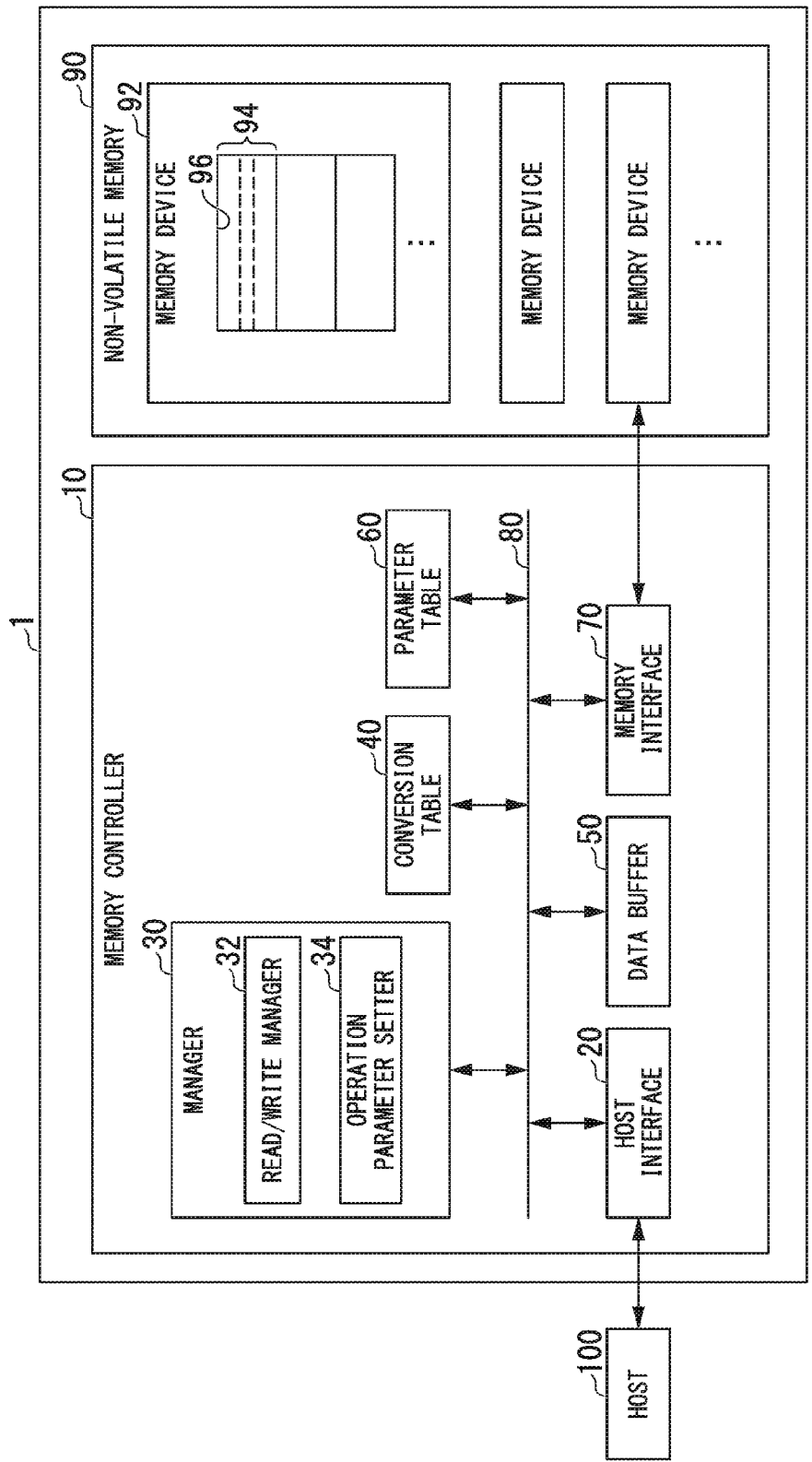
FIG. 1 shows an example of a memory system according to an embodiment.

FIG. 1 is a block diagram of a memory system 1 according to an embodiment. The memory system 1 has a memory controller 10 and a non-volatile memory 90. The memory controller 10 includes a host interface 20, a manager 30, a conversion table 40, a data buffer 50, a parameter table 60, and a memory interface 70, but not limited thereto.

The host interface 20 communicates with a host 100 in accordance with a prescribed interface standard. The interface standard may be SATA (serial ATA), SAS (Serial Attached SCSI) or PCIe (Peripheral Component Interconnect Express), but is not limited thereto. The host interface 20 is connected to the host 100 via a connector, and receives various commands from the host 100. The commands may be sent autonomously from the host 100 or may be sent from the host 100 in response to the memory system 1 requesting the host 100 to transmit a command (by command fetching), which is carried out in response to a notification from the host 100.

The host (client) 100 may be an information processing device such as a personal computer, a tablet terminal, or a server device or imaging device, or may be a mobile terminal such as a smartphone, a game device, or a vehicle-borne terminal such as a car navigation system. The host 100 may be an information processing device used by the user of the memory system 1, or may be a device that transmits various commands to the memory system 1 based on commands received from a different device. The host 100 may, based on the results of internal information processing, generate various commands and transmit them to the memory system 1.

The host 100, for example, includes an LBA (logical block address), which is an example of a logical address, in a command that requests a read or a write of data and transmits the command to the memory system 1. The memory system 1 may be housed in the enclosure of the host 100, or may be provided independently of the host 100.

The manager 30 may include a read/write manager 32 and an operation parameter setter 34, but is not limited thereto. One or both of the read/write manager 32 and the operation parameter setter 34 may be implemented by hardware, such as an LSI (large-scale integration) device, an ASIC (application-specific integrated circuit), FPGA (field-programmable gate array) or a PLC (programmable logic controller), and may have circuitry to implement each of these functions. One or both of the read/write manager 32 and the operation parameter setter 34 may be implemented by a processor such as a CPU (central processing unit) executing a program, and may be implemented by the combination of hardware and a program.

The conversion table 40, the data buffer 50, and the parameter table 60 are stored in a volatile memory (not shown) of the memory system 1. Various types of RAMs, such as SRAM (static random-access memory), a DRAM (dynamic random-access memory), may be used as the volatile memory. The conversion table 40 and the parameter table 60 are stored (saved) in the non-volatile memory 90 by the manager 30 when power supply to the memory system 1 is terminated, and are read out from the non-volatile memory 90 and loaded to the volatile memory by the manager 30 when the power supply is resumed.

The read/write manager 32 writes data into the non-volatile memory 90 based on a write command received from the host 100 via the host interface 20 and instructs the memory interface 70 to read data from the non-volatile memory 90 based on a read command received from the host 100 via the host interface 20.

If the read/write manager 32 receives a write command from the host 100, the read/write manager 32 prepares a writing area in the data buffer 50, and transmits a data transmission request to the host 100. Upon receiving the data transmission request, the host 100 transmits data to be written (hereinafter "write data") to the memory system 1. The write data received by the memory system 1 from the host 100 are stored in the data buffer 50. Then, the read/write manager 32 issues an instruction to the memory interface 70 so that the data stored in the data buffer 50 are written in the physical location of the non-volatile memory 90 at a physical address associated with the LBA appended to the write command. The memory system 1, instead of acquiring the write data separately from the write command, may receive a command including the write data from the start.

If a read command is received from the host 100, the read/write manager 32 issues an instruction to the memory interface 70 so that data are read out from a physical location of the non-volatile memory 90 at a physical address associated with the LBA appended to the read command and written into the data buffer 50. Then, the data that have been written into the data buffer 50 are transmitted to the host 100 by the host interface 20 (read processing). The read processing is not limited to processing based on the read command from the host 100, and includes processing occurring during rewriting processing such as garbage collection and refreshing, which will be described below. The data buffer 50 includes an area in which data to be written in the non-volatile memory 90 are stored, an area in which data read-out from the non-volatile memory 90 are stored before being transmitted to the host 100, and an area in which data are stored for moving data, which will be described below. The read/write manager 32 may perform error correction processing when the read processing is carried out.

FIG. 2 shows one example of contents of the conversion table 40. The conversion table 40 is a table for mutual conversion between logical addresses such as LBAs and physical addresses in the non-volatile memory 90. LBAs are serially numbered logical addresses (serial information) assigned to sectors having a size of, for example, 512B, starting at 0. A physical address may be represented as a block number and a page number, but is not restricted to these. In the conversion table 40, LBAs and invalid flags, which indicate that data are invalid, may be associated with respect to physical addresses. Invalid data are not associated with any logical address, and valid data are associated with a logical address.

If an operation of writing data into the non-volatile memory 90 changes a relationship between the physical address and the LBA, the read/write manager 32 updates the conversion table 40. The memory system 1 may have one conversion table 40, or may have a plurality of conversion tables 40 redundantly.

The invalid flag is information that is set as information (for example 1) indicating invalidity if data associated with the same LBA are written into another physical address. For example, if a write command is received from the host 100 that specifies an LBA that is associated with data that were written into the non-volatile memory 90 based on a previous write command from the host 100, and data associated with the write command (new write command) are written into the non-volatile memory 90, the invalid flag for the storage location (an LBA and a physical address pair) of the past written data is set to 1. Also, if data are moved through garbage collection, refreshing, or the like within the non-volatile memory 90 by the manager 30, the invalid flag for the storage location of the data before movement (an LBA and physical address pair) is set to 1.

The garbage collection is processing of moving valid data stored in at least one block 94 to another block 94 and mapping the block from which the valid data are moved as a free block. A free block is a block 94 in which no valid data are stored, and into which, after erasing invalid data, new data can be written.

The refreshing is processing of rewriting data stored in an entire target block 94 into another block 94. The manager 30, for example, executes the refreshing when the number of blocks that are subjected to read processing reaches a prescribed number, or when the number of errors detected from data read out from the block 94 reaches a prescribed number.

If a plurality of physical addresses is associated with an LBA appended to a read command in the conversion table 40, the read/write manager 32 instructs the memory interface 70 to read data out from a physical address for which the invalid flag is not set to 1 (a physical address at which valid data are stored) and write the data into the data buffer 50. If a plurality of physical addresses is associated with an LBA appended to a read command in the conversion table 40, the processing to read data out from a physical address for which the invalid flag is not set to 1 and write the data into the data buffer 50 may be performed by the memory interface 70.

The conversion table 40, rather than including the invalid flags, may be operated such that LBAs associated with invalid data are deleted therefrom.

The host 100, instead of information such as the LBAs, may append arbitrary key information to a command and transmit the command to the memory system 1. In this case, the memory system 1, in place of the conversion table 40 for conversion between LBAs and physical addresses, performs processing using a conversion table for conversion between the key information and physical addresses. Such a conversion table may be one that indicates a correspondence between hashed key information and physical addresses.

The operation parameter setter 34 sets operation parameters that are referenced when the read/write manager 32 performs read processing and/or write processing. The operation parameters are obtained by referencing the parameter table 60, which will be described below.

The memory interface 70 includes, for example, an interface circuit that serves as the interface to the non-volatile memory 90, an error correction circuit, and a DMA (direct memory access) controller (now shown). The memory interface 70 writes data stored in the data buffer 50 into the non-volatile memory 90 and reads out data stored in the non-volatile memory 90 into the data buffer 50.

The non-volatile memory 90 is a memory that can store data in a non-volatile manner, for example, a flash memory such as a NAND memory. In the case of a NAND memory, the non-volatile memory 90 may be a planar (i.e., two-dimensionally arranged) NAND memory or a three-dimensional (i.e., three-dimensionally arranged) NAND memory. Additionally, a ReRAM (resistive random-access memory) or an FeRAM (ferroelectric random-access memory) or the like may be used as the non-volatile memory 90. In the description below, the non-volatile memory 90 is a NAND memory. The memory system 1 may be a memory card or the like, in which the memory controller 10 and the non-volatile memory 90 are integrated in one package, and may be an SSD (solid-state drive).

The non-volatile memory 90 includes one or more memory devices (memory chips) 92. Each memory device 92 has one or more blocks 94. A memory block 94 is a unit of erasing data. Each block 94 includes one or more pages 96. The memory controller 10 can access each memory device 92 both in parallel and asynchronously.

The processing by the operation parameter setter 34 by referencing the parameter table 60 will be described below. In the following description, the read/write manager 32 will be taken as performing read processing and write processing with the page 96 as the unit.

The parameter table 60 includes a first parameter table 62 and a second parameter table 64, but is not limited thereto. FIG. 3 shows one example of contents of the first parameter table 62. As shown in FIG. 3, in the first parameter table 62, various operation parameters (first parameters) are associated with page numbers, which are examples of identification information of the pages 96. An operation parameter, in the present embodiment, is a read voltage with which data are read data from that page, e.g., voltage applied to word lines and voltage applied to lines (e.g., bit lines) other than word lines during the reading operation, but is not limited thereto. For example, the operation parameter may be a length of a time period during which the read voltage is kept being applied, so that the read voltage becomes stable. The operation parameter may be a vector quantity that includes a plurality of elements. Although, the first parameter table 62 shown in FIG. 3 is represented for one page space, the first parameter table 62 may be in units of one memory device 92 or in units of one block 94.

In the present embodiment, the first parameter, instead of being set so as to cover all pages 96 in the non-volatile memory 90, is set for part of the pages 96, as will be described below. The operation parameter setter 34 performs processing to perform an estimation of a value of the first parameter using the second parameter table 64 for pages 96 for which a specific value of the first parameter is not set. The processing may be performed to add the estimated first parameter to the first parameter table 62 to fill out the contents of the first parameter table 62.

FIG. 4 shows one example of contents of the second parameter table 64. As shown in FIG. 4, in the second parameter table 64, for example, a part or all of a writing generation number, physical position information, environment information such as temperature at the time of writing, the number of readouts after performing writing, and the number of erasures through garbage collection or refreshing is included with respect to each page number, which is an example of identification information of a page 96. That is, the second parameter may be a vector quantity that includes a plurality of the above, or a scalar value that includes one of the above.

The contents of the second parameter table 64, for example, are stored as the result of processing performed by the read/write manager 32 or the memory interface 70, and are collected with respect to each page 96. The contents of the second parameter table 64 may not be collected mainly for the purpose of estimating the first parameter, but may be collected simply as a result of managing the non-volatile memory 90. For that reason, the amount of used memory space does not increase by having the second parameter table 64.

Because the contents of the second parameter table 64, as will be described below, are used to extract common data, data with close values may be grouped together. For example, grouping can be based on the number of readouts from 0 to 100 times, 101 to 200 times, and so on, or values within a certain range can be treated as the same value.

Figure 5:
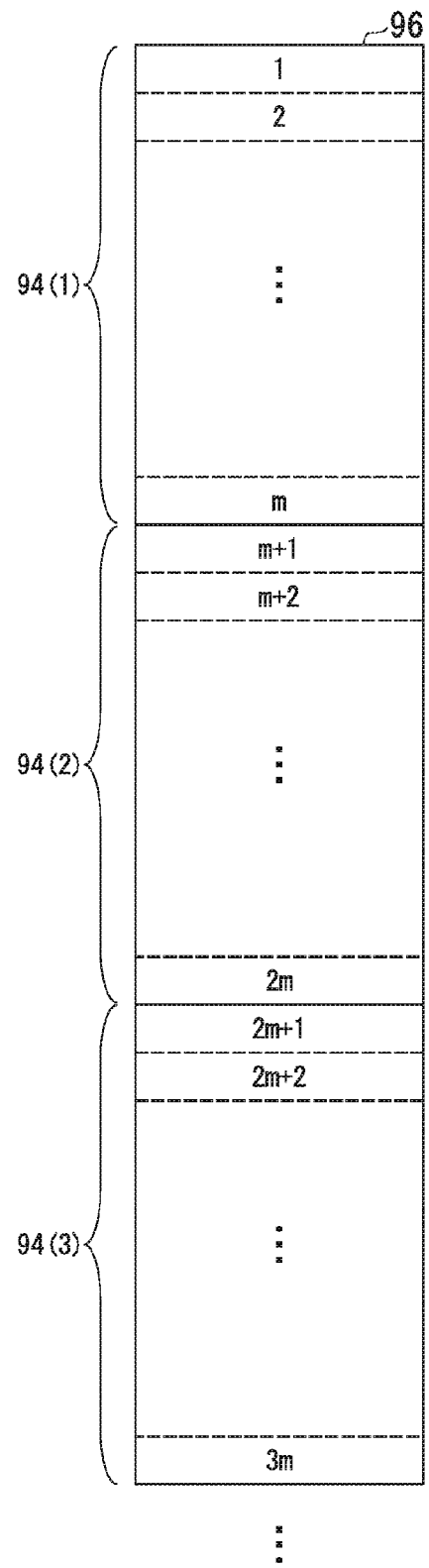
FIG. 5 illustrates a structure of blocks and pages therein to explain writing generation numbers.

FIG. 5 illustrates a structure of blocks and pages therein to explain the writing generation number. In the description to follow, it is assumed that in the memory system 1, when data are written into a certain block 94, writing is continued sequentially in an ascending order of the page number until data are written in all pages 96 of the block 94 without writing data into another block. As shown in FIG. 5, first numbers 1 through m are assigned to the pages 96 of the block 94(1) in accordance with the writing sequence. When this assignment is completed, for example, the writing generation number m is assigned in common to each page 96 of the block 94(1). Instead, the writing generation numbers 1 to m may be assigned to each of the pages 96. In the same manner, the numbers m+1 to 2 m are assigned to the pages 96 of the block 94(2) in accordance with the writing sequence. When this assignment is completed, for example, the writing generation number 2 m is assigned in common to each page 96 of the block 94(2). The same is done for block 94(3) and thereafter.

As described above, the writing generation number tends to be smaller with respect to pages or block that has not been erased for a longer period of time (elapsed time). Although the difference in the writing generation number is not directly proportionate to the difference in the elapsed time, because the frequency of writing is not uniform, a page 96 having a smaller writing generation number can be said to have a longer elapsed time compared with a page 96 having a larger writing generation number. Instead of the writing generation number, the elapsed time may be used.

Returning to the description of the operation parameter setter 34, if an operation parameter is registered in the first parameter table 62 for a page 96 specified by a read command (hereinafter referred to as the target page), the operation parameter setter 34 supplies the registered operation parameter to the read/write manager 32 as the setting value. If the operation parameter is a read voltage, the read/write manager 32 specifies that read voltage and instructs the memory interface 70 to read out data. In the non-volatile memory 90, readout of the target page is done by applying the specified read voltage to the word line (not shown).

In contrast, if the operation parameter is not registered in the first parameter table 62 for the target page, the operation parameter setter 34 determines a value of the operation parameter of the target page based on a value of an operation parameter set for another page 96 (hereinafter referred to as a reference page) other than the target page in the first parameter table 62.

Figure 6:
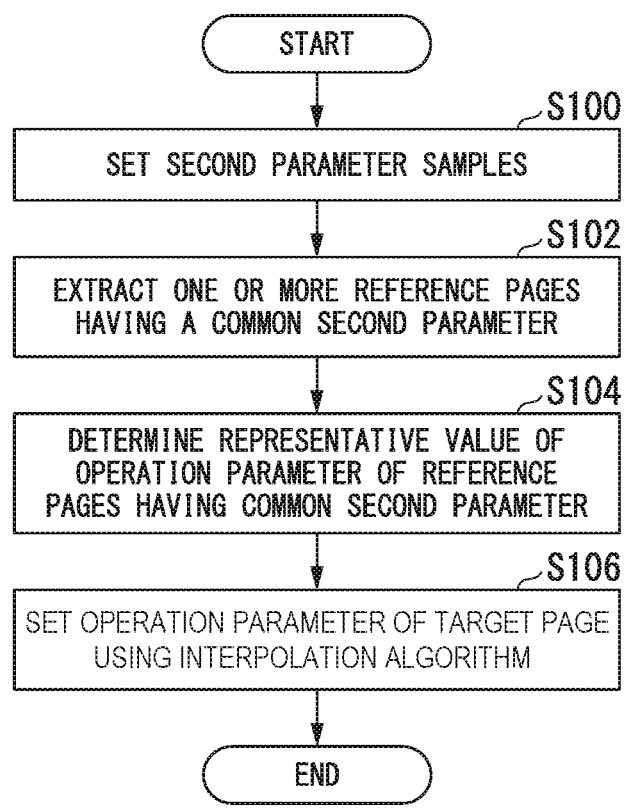
FIG. 6 is a flowchart showing a flow of processing carried out by an operation parameter setter of the memory system.

FIG. 6 is a flowchart showing a part of the flow of processing by the operation parameter setter 34. First, the operation parameter setter 34 sets (selects) n samples of the second parameter (S100). Then samples are defined as $x_i$ (where I=1 to n). For example, if the second parameter is only the writing generation number, the second parameter samples are set with uniform spacing, such as 5 m, 10 m, 15 m. If the value of the operation parameter changes either logarithmically or exponentially depending on the value of the second parameter, the spacing of the samples may be adjusted to the characteristic. The $x_i$ may be a vector quantity or a scalar value.

Next, the operation parameter setter 34 extracts the address of k reference pages (where k is a natural number of 1 or greater) that have a common value of the second parameter, with regard to each of the second parameter samples (S102). This is defined as $A_{ij}$, where $A_{ij}$ signifies the address of the j-th reference page of the reference pages having the parameter $x_i$.

Figure 7:
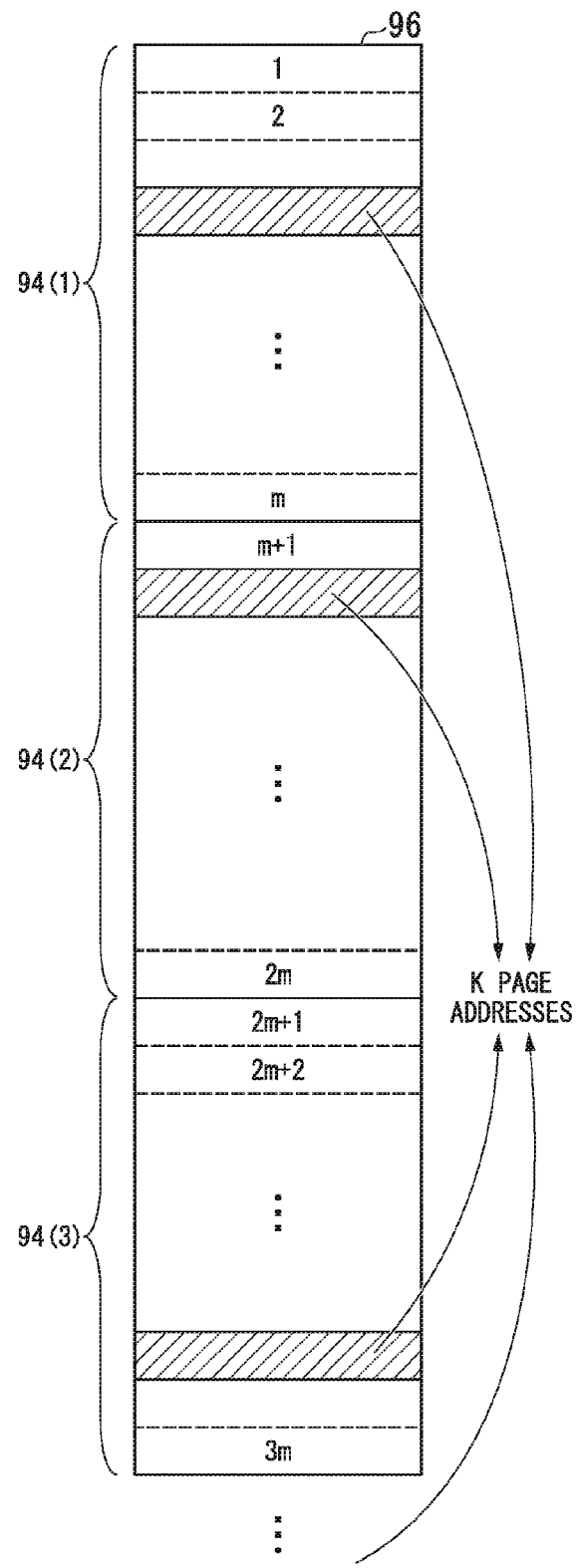
FIG. 7 illustrates a manner in which one or more page addresses are extracted from each block.

At S102, the operation parameter setter 34 selects a part or all of the blocks 94 from the non-volatile memory 90 (or from a memory device 92) and extracts from each selected block one or more addresses of pages 96. FIG. 7 shows the manner in which the addresses of one or more pages are extracted from each block.

Figure 8:
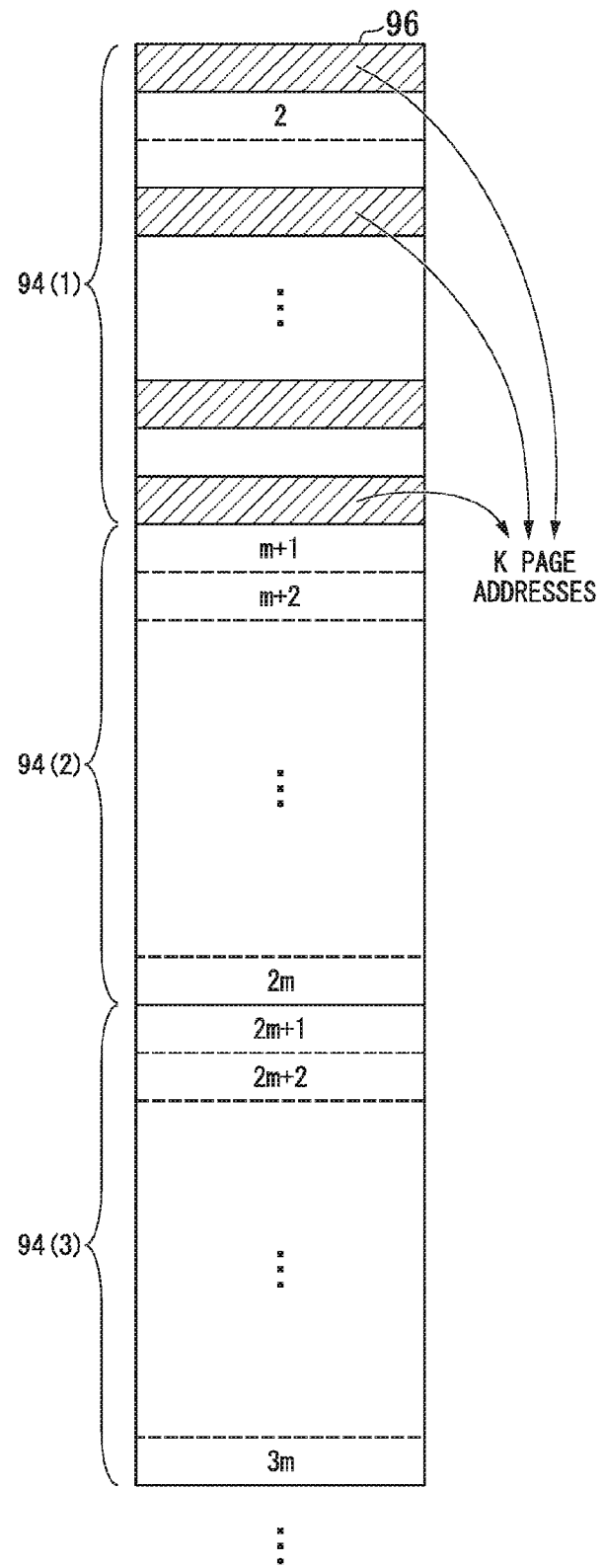
FIG. 8 illustrates a manner in which a plurality of page addresses is extracted from a selected block.

At S102, the operation parameter setter 34 selects a part (one or a plurality) of the blocks 94 from the non-volatile memory 90 (or from a memory device 92) and extract the addresses of a plurality of pages 96 from the selected blocks. FIG. 8 shows the manner in which the addresses of the plurality of pages are extracted from the selected block.

Next, the operation parameter setter 34 determines the operation parameters for each of the addresses of the extracted reference pages and determines a representative value thereof (S104). The operation parameter setter 34, for example, extracts the operation parameters of reference pages registered in the first parameter table 62, and calculates the representative value thereof. The representative value is, for example, an average value, a most frequently occurring value, a median value, or an average value or a median value excluding singular values. In the following, the representative value is defined as $P_i$, which is, for example, expressed by Equation (1), in which $P_{ij}$ is the operation parameter of a reference page at the address $A_{ij}$.

$$P_i = \{\Sigma_{j=1}^{k}(P_{ij})\}/k \quad (1)$$

The operation parameter setter 34 then, applies an interpolation algorithm to the second parameter $x_i$ determined at S104 and the set of representative values $P_i$ corresponding thereto, and sets the operation parameter of the target page (S106). Various algorithms, employing Lagrangian interpolation, spline interpolation, linear interpolation, or the like can be used as the interpolation algorithm. The operation parameter setter 34, for example, selects the model that is the best fit to the distribution of the representative value $P_i$ associated with the distribution of the second parameter $x_i$, and inputs the second parameter of the target page so as to build a function that derives the operation parameter of the target page. The "function" is used as a convenience, and not limited to a closed-form function. For example, the "function" may be a "rule" to obtain the operation parameter by an algorithm that performs iterative processing.

Figure 9:
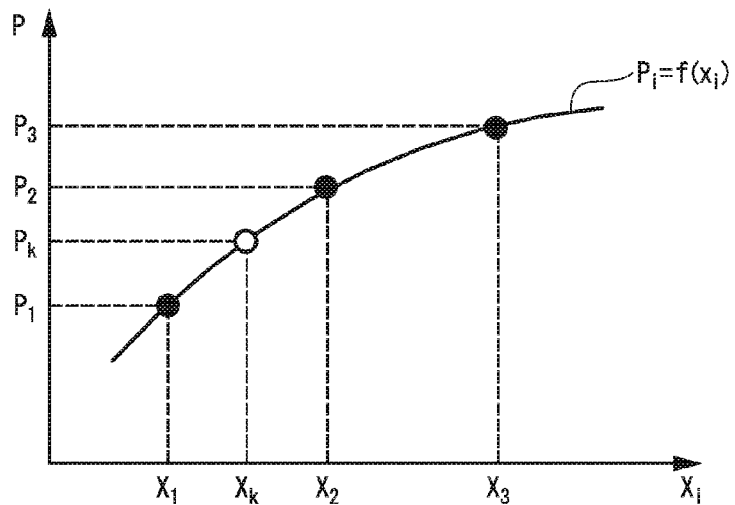
FIG. 9 is a graph illustrating a relationship between two parameters to explain processing to determine a function representing the relationship.

FIG. 9 is a graph for explaining the processing of determining the function that leads to the value of the operation parameter of a target page. In FIG. 9, $x_i$ is assumed to be a scalar value. As shown in FIG. 9, the operation parameter setter 34, based on the relationship of the representative value $P_i$ determined at S104 with respect to the samples $x_i$ (where i=1 to 3) of the second parameter, determines a model of a straight line, a polynomial curve, an exponential curve, a logarithmic curve and the like, or the combination thereof, thereby determining the function f expressed as $P_i = f(x_i)$. By taking the second parameter $x_k$ of the target page as the argument of the function f, the value of the operation parameter $P_k$ of the target page is determined.

Although the example of FIG. 7 assumes that $x_i$ is a scalar value, if $x_i$ is a vector quantity, the operation parameter setter 34 may perform the following processing. For example, if $x_i$ is a vector quantity that includes two elements, and these elements are s and t, the function f is expressed as shown below. In this manner, the operation parameter setter 34 may use a part of the elements of $x_i$ as a parameter for function selection (to establish the valid range for the function) and use the other part of the elements as an argument of the function in order to determine the operation parameter.

$$f = f_1(t) \text{ if } s_{i-1} < s < s_i$$
$$= f_2(t) \text{ if } s_i < s < s_{i+1}$$
$$= \ldots$$

If $x_i$ is a vector quantity that includes three or more elements, the operation parameter setter 34 may select both the valid range of the function and the valid range of the argument based on a part of the elements. The following is an example of the function f for the case of $x_i$ including the three elements s, t, and u. The operation parameter setter 34 may derive the operation parameter by, for example, determining a weighted sum of the results of the function set for each element individually.

$$f = f_1(t) \text{ if } s_{i-1} < s < s_i$$
$$= f_2(t) \text{ if } s_i < s < s_{i+1}$$
$$= f_1(u) \text{ if } s_{i+1} < s_{i+2}$$
$$= f_2(u) \text{ if } s_{i+2} < s_{i+3}$$
$$= \ldots$$

Figure 10:
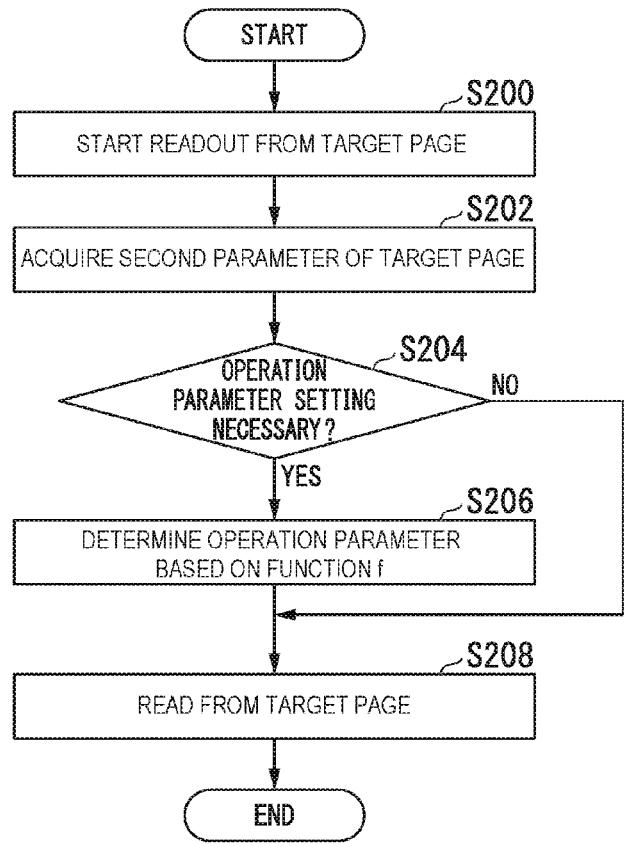
FIG. 10 is a flowchart showing a flow of processing executed by the memory system 1.

The flow of the overall processing carried out by the memory system 1 to determine the value of the operation parameter in accordance with the principle described above will be described below. FIG. 10 shows a flow of processing executed in the memory system 1. The processing of this flowchart assumes that sufficient data are accumulated in the first parameter table 62 and the second parameter table 64, and that a function f that covers the overall non-volatile memory 90 has been determined. This state is achieved, for example, at the first time the memory system 1 is started, or at each starting, by determining a value of the operation parameter of each page 96 through Vth tracking or the like, storing a part thereof in the first parameter table 62, and also by determining the function f that covers the overall non-volatile memory 90. The processing of determining the values of operation parameters and the function f, for example, is executed at the time of the above-described first starting or at each starting, at which the memory system 1 is usually not busy (when a command is not received from the host 100 or the frequency of reception if low). The Vth tracking will be described below.

First, the manager 30 starts the readout from a page (S200). Next, the operation parameter setter 34 acquires a value of the second parameter of that page (S202). In the description of FIG. 10, "that page" refers to the page at which readout is started at S200.

Next, the operation parameter setter 34 determines whether or not it is necessary to set a value of the operation parameter regarding that page (S204).

At S204, the operation parameter setter 34, for example, instructs the read/write manager 32 to attempt read processing one time and, if data can be read out normally, the operation parameter setter 34 determines that it is not necessary to set the value of the operation parameter. At S204, if, based on the number of erasures of that page, the operation parameter setter 34 determines that the state of the operation parameter has not changed from the previous time, the determination may be made that it is unnecessary to set the operation parameter. At S204, the operation parameter setter 34 may determine whether or not it is necessary to set the operation parameter based on the state of another page 96 of the block 94 to which that page belongs.

If it is determined that it is not necessary to set the value of the operation parameter for that page, the read/write manager 32 uses an already set or a default value of the operation parameter to perform readout from that page (S208). If, however, it is determined that it is necessary to set the operation parameter for that page, the operation parameter setter 34 determines the operation parameter based on the function f (S206), and the read/write manager 32 uses the operation parameter determined at step S206 to read out from that page (S208).

Figure 11:
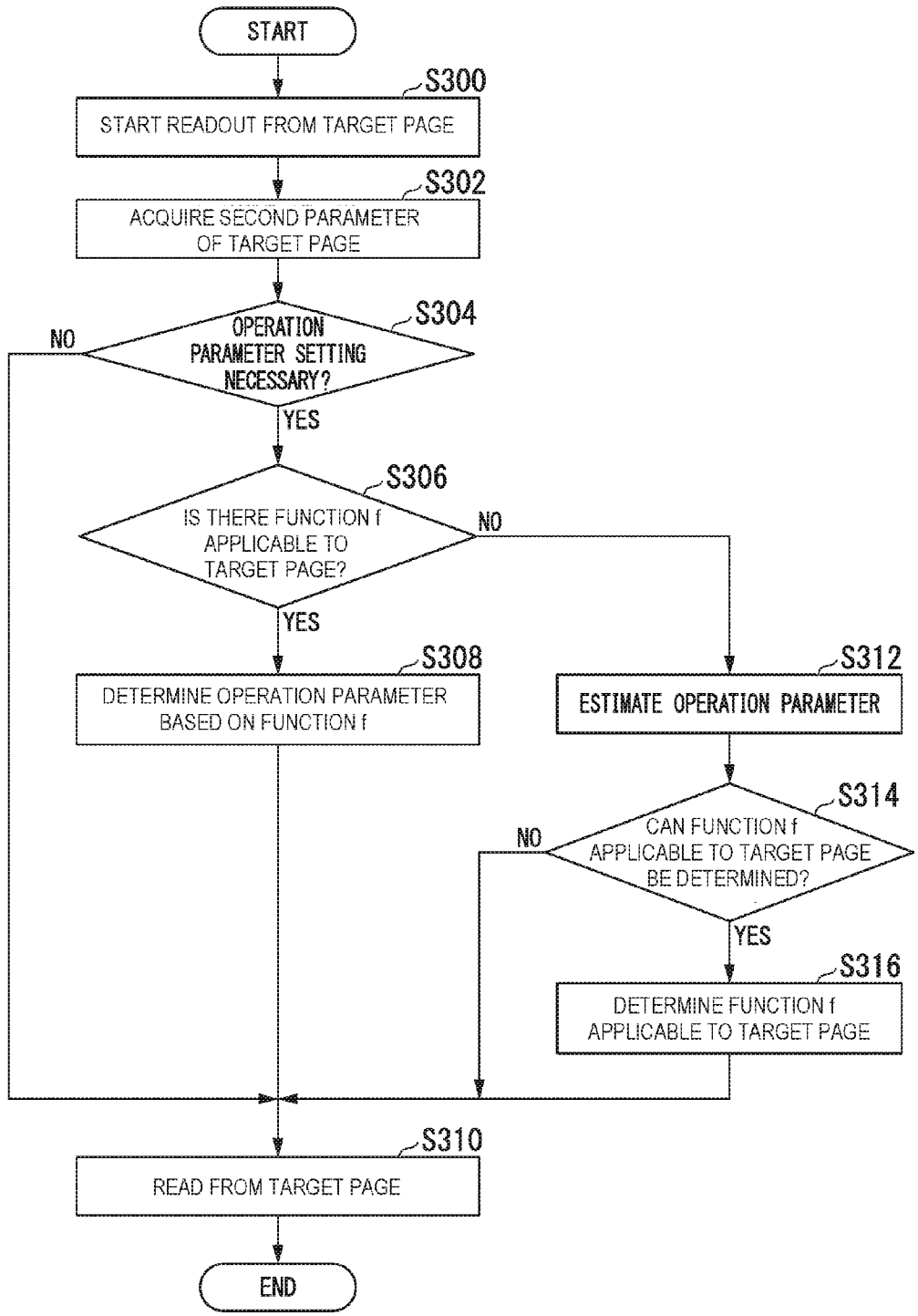
FIG. 11 is a flowchart showing another example of the flow of the processing executed by the memory system 1.

FIG. 11 shows another example of the flow of processing executed in the memory system 1. The processing of this flowchart can be applied in the case in which sufficient data to determine the function f, have not been accumulated in the first parameter table 62 and the second parameter table 64 and/or a function f that covers the overall non-volatile memory 90 has not been determined.

First, the manager 30 starts readout from the page (S300). Next, the operation parameter setter 34 acquires the second parameter of that page (S302). In the description of FIG. 11, "that page" refers to the page at which readout is started at S300. Next, the operation parameter setter 34 determines whether or not it is necessary to set the operation parameter for that page (S304). The processing of this step may be the same as the processing of S204 in FIG. 10.

If it is determined that it is not necessary to set a value of the operation parameter for that page, the read/write manager 32 uses an already set or a default operation parameter to perform readout from that page (S310). If, however, it is determined that it is necessary to set a value of the operation parameter for that page, the operation parameter setter 34 determines whether or not a function f that can be applied to that page has been determined (S306). If a function f that can be applied to that page has been built, the operation parameter setter 34 derives the operation parameter based on the function f (S308), and the read/write manager 32 uses the value of the operation parameter determined at step S308 to perform readout from that page (S310).

At step 306, if it is determined that a function f that can be applied to that page has not been determined, the operation parameter setter 34 estimates a value of the operation parameter of that page (S312). The processing of this step is achieved by, for example, Vth tracking or shift reading.

Next, the operation parameter setter 34 determines whether or not, as a result of the estimation of the operation parameter, a function f applicable to that page can be determined (S314). If a function f applicable to that page cannot be determined, the read/write manager 32 uses a value of the operation parameter estimated at S312 to read out data from that page (S310).

If a function f that can be applied to that page can be determined, the operation parameter setter 34 determines the function f that can be applied to that page (S316). The read/write manager 32 then uses a value of the operation parameter estimated at S312 to perform readout from that page (S310).

After the processing shown in FIG. 11, the read/write manager 32 determines whether or not the readout succeeded. If the readout succeeded, the read/write manager 32 transmits the read results to the host 100 via the host interface 20. However, if the readout failed, the read/write manager 32 executes retry read processing in accordance with a plurality of steps (for example, three steps). In the first step of the retry read processing, coarse Vth tracking is carried out, and the resulting read voltages are used to perform memory cell read processing, and error correction is carried out with respect to read data using a less extensive ECC decoding method. In the second step of the retry read processing, memory cell read processing is carried out using coarse read voltages obtained as a result of the coarse Vth tracking, and error correction is carried out with respect to the read data using a more extensive decoding method. The more extensive decoding method is an error correction method with a high error-correction capability, and in which errors existing in the read results are corrected. The extensiveness of the ECC decoding method indicates a relative level of error-correction capability. That is, a more extensive ECC decoding method has an error-correction capability that is higher than a less extensive ECC decoding method and is capable or correcting more bit errors. In the third step of the retry read processing, a fine Vth tracking is carried out and fine read voltages obtained as a result are used to perform read processing of a memory cell, and an error correction is carried out with respect to the results thereof using a more extensive ECC decoding method. The fine Vth tracking is carried out with a finer difference of read voltages than the coarse Vth tracking and under conditions in which the number of read operations required to search one value is greater.

Figure 12:
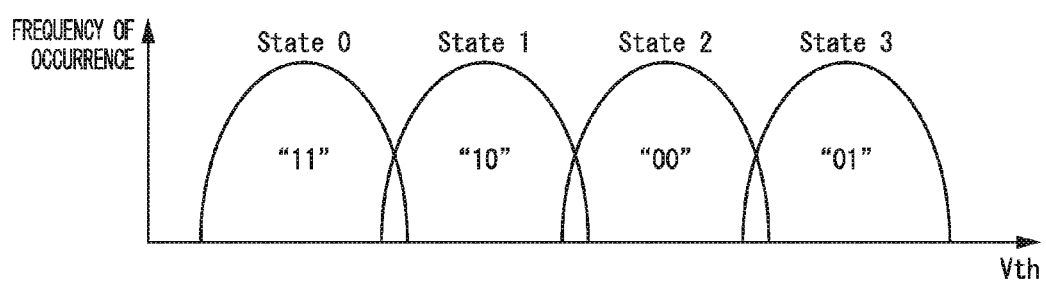
FIG. 12 shows an example of distribution of threshold voltages in a 2-bit cell.

The Vth tracking will be described in more detail. FIG. 12 shows an example of threshold voltage distribution in a 2-bit cell, in which the horizontal axis represents the threshold voltage Vth, and the vertical axis represents frequency of occurrence. If the number of states that a memory cell can take is N, for a 2-bit cell, N=4 (that is, $2^2$). The memory cell threshold voltage exhibits a four-lobe distribution, in accordance with the bit information that is written. From the low threshold voltage end, these are bit information of 11, 10, 00, and 01. Additionally, the states of falling into each of the memory cell threshold voltage lobes are state 0, state 1, state 2, and state 3, respectively.

Figure 13:
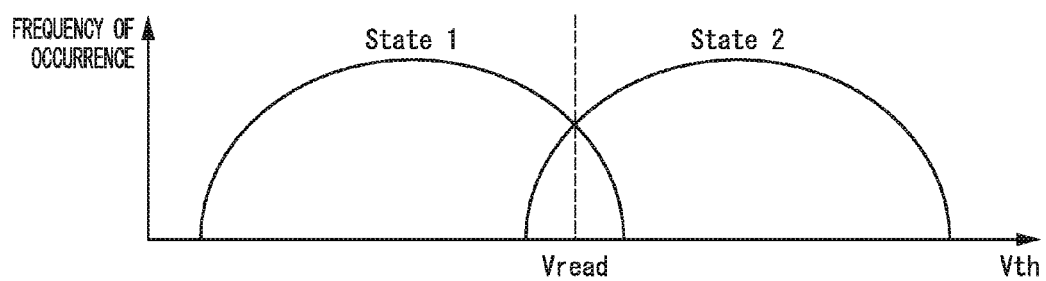
FIG. 13 shows an example of a relationship between the threshold distribution and the read voltage.

FIG. 13 shows, in schematic form, an example of the relationship between the threshold distribution and the read voltage. In FIG. 13, state 1 and state 2 of FIG. 12 are enlarged. As shown in FIG. 12 and FIG. 13, there is partial overlap between neighboring lobes of the threshold voltage distribution. The operation parameter setter 34 determines the read voltage Vread for distinguishing between state 1 and state 2 so that the sum of the probability that the memory cell written as state 1 is read out as state 2 and the probability that the memory cell written as state 2 is read out as state 1 is minimum, thereby estimating the read voltage, which is one of the operation parameters.

The operation parameter setter 34 divides the range of the threshold voltage that the memory cells can take into a prescribed number of sub-ranges and reads out each memory cell with the read voltage associated with each of the sub-ranges. The operation parameter setter 34 then counts the number of bits that are below some read voltage. After that, the difference in the number of bits counted having neighboring read voltages is calculated. By disposing these in read voltage sequence, the Vth distribution is obtained. The points at which the difference in the number of bits having neighboring read voltages is minimum are determined, and the corresponding voltages are determined as the valleys of the Vth distribution, that is, the read voltages.

According to this Vth tracking, the read voltage for each page 96 can be estimated. However, if it is necessary to perform the Vth tracking each time the memory system 1 performs read processing, latency of the memory system 1 will increase. In the memory system 1 of the present embodiment, even if the Vth tracking is performed for the entire non-volatile memory 90 one time, the read voltage is held for some of the pages 96 thereafter and the read voltage is determined using the function f when reading out from the other pages 96, so that the processing time can be shortened. As a result, according to the present embodiment, the latency can be improved, and, compared to the case of holding the operation parameters such as the read voltage for all of the pages 96, the capacity of the non-volatile memory used for storing the values of the read voltages can be reduced.

The operation parameter setter 34 may, instead of the Vth tracking, estimate the operation parameters using shift reading. In that case, the operation parameter setter 34 causes the read/write manager 32 to execute read processing while successively changing the read voltage and estimates the read voltage when the readout succeeds as the optimum operation parameter. When the read voltage is successively changed, the operation parameter setter 34 may start from some value and either increase or decrease the read voltage in prescribed steps, or may use a successive sequence of read voltage values that are stored in a read voltage list beforehand.

According to the above-described embodiment, the memory system 1 has a non-volatile memory 90 and a memory controller 10 that performs processing with respect to the non-volatile memory 90 based on a command from the host 100 and that performs read processing using a value of an operation parameter set or determined for each unit of the non-volatile memory 90. If a value of the operation parameter is not set for a target unit of processing, and the memory controller 10 performs interpolation, based on a value of a second parameter already obtained for the target unit and another value of the second parameter set for another unit that has already been obtained, and determines the value of the operation parameter for the target unit, thereby improving latency of the memory system 1.

While certain embodiments of the present inventions have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a non-volatile memory; and
a controller configured to
maintain a relationship between a first parameter value and a second parameter value for first and second pages of the non-volatile memory,
determine from the relationships, the first parameter value of the first page and the first parameter value of the second page,
determine a first parameter value to be used for reading data from a target page of the non-volatile memory based on at least the determined first parameter value of the first page, the determined first parameter value of the second page, and a second parameter value of the target page, and
carry out a read operation with respect to the target page using the determined first parameter value of the target page.

2. The memory system according to claim 1, wherein the second parameter value corresponds to a page number, and
the first parameter values of the first and second pages are respectively determined from the relationships maintained for the first and second pages using a corresponding page number of the first and second pages.

3. The memory system according to claim 1, wherein the second parameter value corresponds to a physical location of the page,
the first parameter values of the first and second pages are respectively determined from the relationships maintained for the first and second pages using a corresponding physical location of the first and second pages.

4. The memory system according to claim 1, wherein the second parameter value corresponds to a temperature at which a write operation has been carried out with respect to the page, and
the first parameter values of the first and second pages are respectively determined from the relationships maintained for the first and second pages using a corresponding temperature of the first and second pages.

5. The memory system according to claim 1, wherein the second parameter value corresponds to a count of number of times a reading operation has been carried out with respect to the page, and
the first parameter values of the first and second pages are respectively determined from the relationships maintained for the first and second pages using a corresponding count of the first and second pages.

6. The memory system according to claim 1, wherein the second parameter value corresponds to a count of number of times an erasing operation has been carried out with respect to the page, and
the first parameter values of the first and second pages are respectively determined from the relationships maintained for the first and second pages using a corresponding count of the first and second pages.

7. The memory system according to claim 1, wherein the controller is further configured to determine the first parameter values to be used for reading data from the target page from the relationship maintained for the target page, when the relationship is maintained for the target page.

8. The memory system according to claim 1, wherein the controller is further configured to carry out a tracking operation to find a target read voltage for the target page, when the relationships cannot be represented by a function, when the read operation with respect to the target page fails.

9. The memory system according to claim 1, wherein the controller is further configured to carry out a shift read operation to find a target read voltage for the target page, when the relationships cannot be represented by a function, when the read operation with respect to the target page fails.

10. The memory system according to claim 1, wherein the first parameter value is a read voltage to be applied to a word line connected to a page.

11. A memory system comprising:
a non-volatile memory; and
a controller configured to maintain a relationship between a first parameter value and a second parameter value for each of some pages of the non-volatile memory, determine that the relationships can be represented by a function, wherein the function receives a second parameter value as an input and generates a first parameter value as an output, determine an output of the function that is generated when a second parameter value of a target page is input into the function, as a first parameter value to be used for reading data from the target page of the non-volatile memory and carry out a read operation with respect to the target page using the determined first parameter value.

12. The memory system according to claim 11, wherein the controller is further configured to carry out a tracking operation to find a target read voltage for the target page, when the relationships cannot be represented by the function.

13. The memory system according to claim 11, wherein the controller is further configured to carry out a shift read operation to find a target read voltage for the target page, when the relationships cannot be represented by the function.

14. The memory system according to claim 11, wherein the controller is further configured to carry out a tracking operation to find a target read voltage for the target page, when the relationships cannot be represented by the function, when the read operation with respect to the target page fails.

15. The memory system according to claim 11, wherein the controller is further configured to carry out a shift read operation to find a target read voltage for the target page, when the relationships cannot be represented by the function, when the read operation with respect to the target page fails.

16. A method of operating a memory system including a non-volatile memory, comprising:

maintaining a relationship between a first parameter value and a second parameter value for first and second pages of the non-volatile memory;

determining from the relationships, the first parameter value of the first page and the first parameter value of the second page, determining a first parameter value to be used for reading data from a target page of the non-volatile memory based on at least the determined first parameter value of the first page, the determined first parameter value of the second page, and a second parameter value of the target page; and carrying out a read operation with respect to the target page using the determined first parameter value of the target page.

17. The method according to claim 16, wherein the second parameter value corresponds to a page number, and the first parameter values of the first and second pages are respectively determined from the relationships maintained for the first and second pages using a corresponding page number of the first and second pages.

18. The method according to claim 16, wherein the second parameter value corresponds to a physical location of the page, the first parameter values of the first and second pages are respectively determined from the relationships maintained for the first and second pages using a corresponding physical location of the first and second pages.

19. The method according to claim 16, wherein the second parameter value corresponds to a temperature at which a write operation has been carried out with respect to the page, and the first parameter values of the first and second pages are respectively determined from the relationships maintained for the first and second pages using a corresponding temperature of the first and second pages.

20. The method according to claim 16, wherein the first parameter value is a read voltage to be applied to a word line connected to a page.

* * * * *